US006205059B1

United States Patent
Gutala et al.

(10) Patent No.: US 6,205,059 B1
(45) Date of Patent: Mar. 20, 2001

(54) METHOD FOR ERASING FLASH ELECTRICALLY ERASABLE PROGRAMMABLE READ-ONLY MEMORY (EEPROM)

(75) Inventors: Ravi P. Gutala, Milpitas, CA (US); Jonathan S. Su, Evanston, IL (US); Colin S. Bill, Cupertino, CA (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 09/166,384

(22) Filed: Oct. 5, 1998

(51) Int. Cl.$^7$ .................................................. G11C 16/04
(52) U.S. Cl. ............................. 365/185.33; 365/185.29; 365/218
(58) Field of Search ..................... 365/185.33, 185.29, 365/185.22, 218

(56) References Cited

U.S. PATENT DOCUMENTS

| | | | |
|---|---|---|---|
| 5,428,568 | * | 6/1995 | Kobayashi et al. .................. 365/185 |
| 5,777,924 | * | 7/1998 | Lee et al. ........................ 365/185.11 |
| 5,875,130 | * | 2/1999 | Haddad et al. .................. 365/185.33 |

* cited by examiner

Primary Examiner—David Nelms
Assistant Examiner—Thong Le
(74) Attorney, Agent, or Firm—David G. Alexander; Arter & Hadden LLP (57) ABSTRACT

A flash Electrically-Erasable Programmable Read-Only Memory (EEPROM) includes a plurality of field effect transistor memory cells, a power supply, and a controller which cooperates with the power supply to apply an erase pulse to the cells, and then erase verify a first byte of cells in each sector. If the first bytes in any sector has not passed erase verify, another erase pulse is applied to the cells of those sectors, and the first byte in each sector which did not pass erase verify the first time is erase verified again. This procedure is continued until the first byte in each sector has passed erase verify. Then, the sectors are processed in sequence to erase and erase verify every cell. First, an erase pulse is applied to all of the cells in the sector. Then, the first byte is erase verified. If the first byte passes erase verify (which it will because it did previously), the next byte is erase verified. Whenever a particular byte does not pass erase verify, another erase pulse is applied to all of the cells in the sector, and the particular cell is again erase verified. This procedure is sequentially performed on all of the bytes in the sector, or alternatively on the cells individually, until all of the cells have passed erase verify.

20 Claims, 6 Drawing Sheets

METHOD FOR ERASING FLASH ELECTRICALLY ERASABLE PROGRAMMABLE READ-ONLY MEMORY (EEPROM)

BACKGROUND OF THE INVENTION

1. Field of the Invention

The present invention generally relates to the art of microelectronic integrated circuits, and more specifically to a method for erasing a flash Electrically Erasable Programmable Read-Only Memory (EEPROM).

2. Description of the Related Art

A microelectronic flash or block erase Electrically Erasable Programmable Read-Only Memory (Flash EEPROM) includes an array of cells which can be independently programmed and read. The size of each cell and thereby the memory are made small by omitting select transistors which would enable the cells to be erased independently. All of the cells are erased together as a block.

A memory of this type includes individual Metal-Oxide-Semiconductor (MOS) field effect transistor memory cells, each of which includes a source, drain, floating gate and control gate to which various voltages are applied to program the cell with a binary 1 or 0, or erase all of the cells as a block.

The cells are connected in a rectangular array of rows and columns, with the control gates of the cells in a row being connected to a respective wordline and the drains of the cells in a column being connected to a respective bitline. The sources of the cells are connected together. This arrangement is known as a NOR memory configuration.

A cell is programmed by applying, typically, 9 V to the control gate, 5 V to the drain and grounding the source, which causes hot electrons to be injected from the drain depletion region into the floating gate. Upon removal of the programming voltages, the injected electrons are trapped in the floating gate and create a negative charge therein which increases the threshold voltage of the cell to a value in excess of approximately 4 V.

The cell is read by applying typically 5 V to the control gate, 1 V to the bitline to which the drain is connected, grounding the source, and sensing the bitline current. If the cell is programmed and the threshold voltage is relatively high (4 V), the bitline current will be zero or at least relatively low. If the cell is not programmed or erased, the threshold voltage will be relatively low (2 V), the control gate voltage will enhance the channel, and the bitline current will be relatively high.

A cell can be erased in several ways. In one arrangement, a cell is erased by applying typically 12 V to the source, grounding the control gate and allowing the drain to float. This causes the electrons which were injected into the floating gate during programming to be removed by Fowler-Nordheim tunneling from the floating gate through the thin tunnel oxide layer to the source. Alternatively, a cell can be erased by applying a negative voltage on the order of –10 V to the control gate, applying 5 V to the source and allowing the drain to float.

A problem with the conventional flash EEPROM cell arrangement is that due to manufacturing tolerances, some cells become over-erased before other cells become erased sufficiently. The floating gates of the over-erased cells are depleted of electrons and become positively charged. This causes the over-erased cells to function as depletion mode transistors which cannot be turned off by normal operating voltages applied to their control gates, and introduces leakage during subsequent program and read operations.

More specifically, during program and read operations only one wordline which is connected to the control gates of a row of cells is held high at a time, while the other wordlines are grounded. However, a positive voltage is applied to the drains of all of the cells. If the threshold voltage of an unselected cell is zero or negative, leakage current will flow through the source, channel and drain of the cell.

Figure 1:
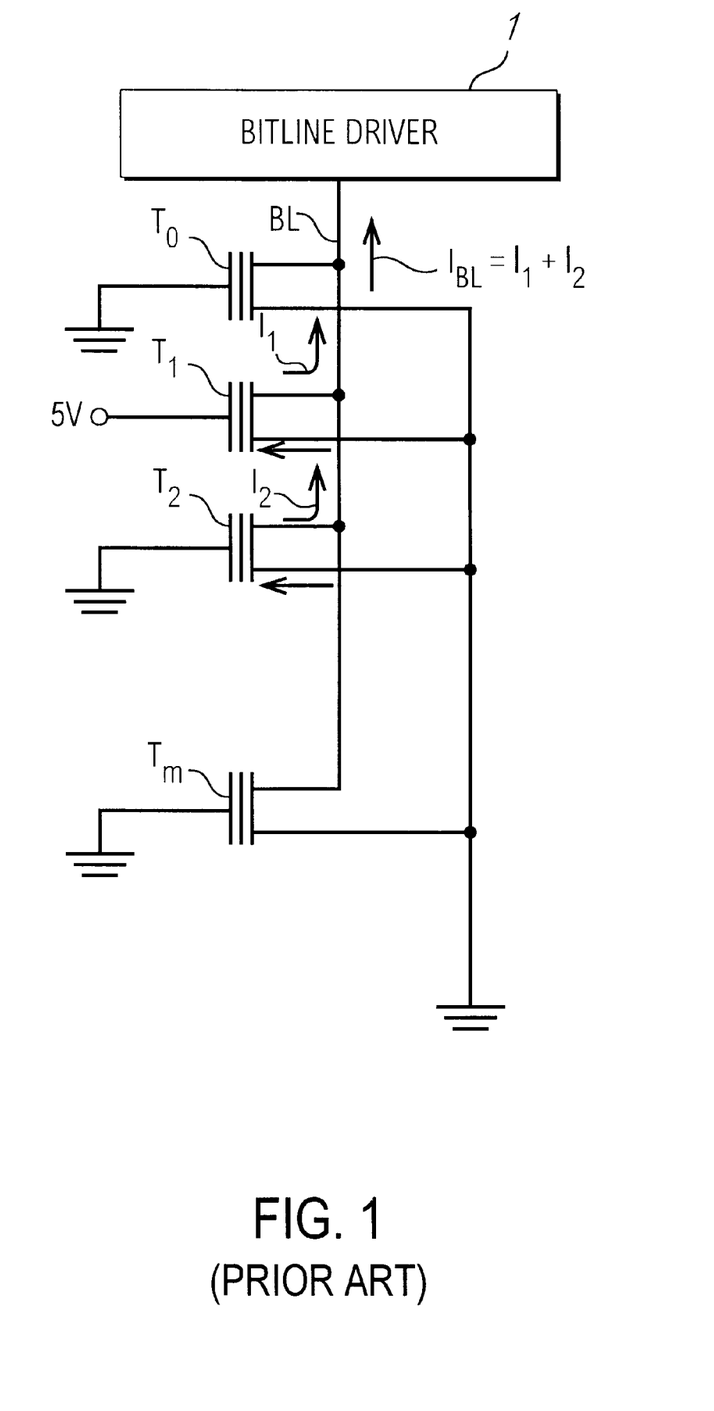
FIG. 1 is a simplified electrical schematic diagram showing how background leakage current is generated in a prior art flash Electrically Erasable Programmable Read-Only Memory (EEPROM)

This undesirable effect is illustrated in FIG. 1. The drains of a column of floating gate cell transistors $T_0$ to $T_m$ are connected to a bitline BL, which is itself connected to a bitline driver 1. The sources of the transistors $T_0$ to $T_m$ are typically connected to ground. One of the transistors $T_{0\ to\ Tm}$ is selected for a program or read operation by applying a positive voltage, e.g. 5 V, to its control gate which turns on the transistor. The control gates of the unselected transistors are connected to ground.

As viewed in FIG. 1, 5 V is applied to the transistor $T_1$ which turns it on. A current $I_1$ flows through the transistor $T_1$ from ground through its source, channel (not shown) and drain and through the bitline BL to the driver 1. Ideally, the bitline current $I_{BL}$ should be equal to $I_1$.

However, if one or more of the unselected transistors, e.g. the transistor $T_2$ as illustrated in FIG. 1, is overerased, its threshold voltage will be zero or negative, and background leakage current will flow through the transistor $T_2$ as indicated at $I_2$. The bitline current $I_{BL}$ is now no longer equal to $I_1$, but is equal to the sum of $I_1$ and the background leakage current $I_2$.

In a typical flash EEPROM, the drains of a large number, for example 512, transistor cells such as illustrated in FIG. 1 are connected to each bitline (column). If a substantial number of cells on the bitline are drawing background leakage current, the total leakage current on the bitline can exceed the cell read current. This makes it impossible to read the state of a cell on the bitline and renders the memory inoperative.

Figure 2:
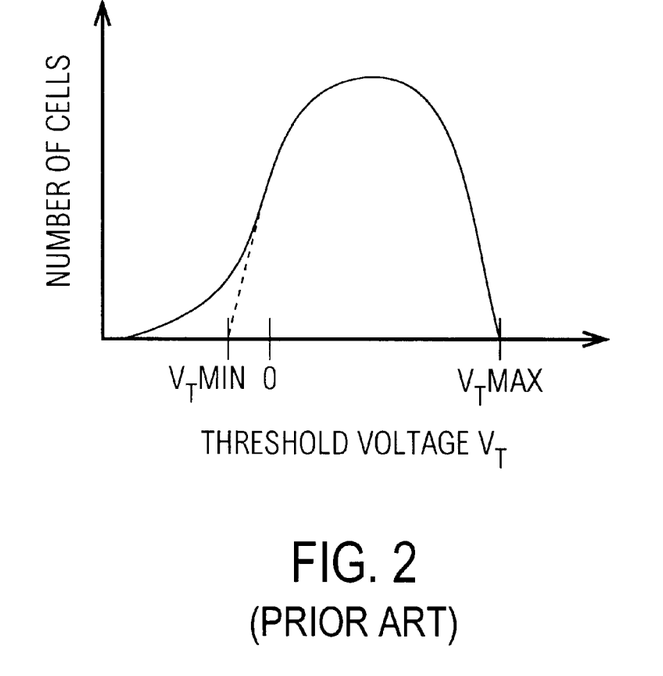
FIG. 2 is a graph illustrating a threshold voltage distribution in a flash EEPROM after an erase operation.

FIG. 2 illustrates how the threshold voltages of the cells or bits in a flash EEPROM can differ substantially from each other following an erase operation as shown by a solid line curve which represents the numbers of cells having particular values of threshold voltage $V_T$. It will be seen that the least erased cells will have a relatively high threshold voltage $V_T$MAX, whereas the most overerased cells will have a low threshold voltage which is below a minimum acceptable value $V_T$MIN that can be negative. The characteristic illustrated in FIG. 2 is known as the threshold voltage distribution.

Figure 3:
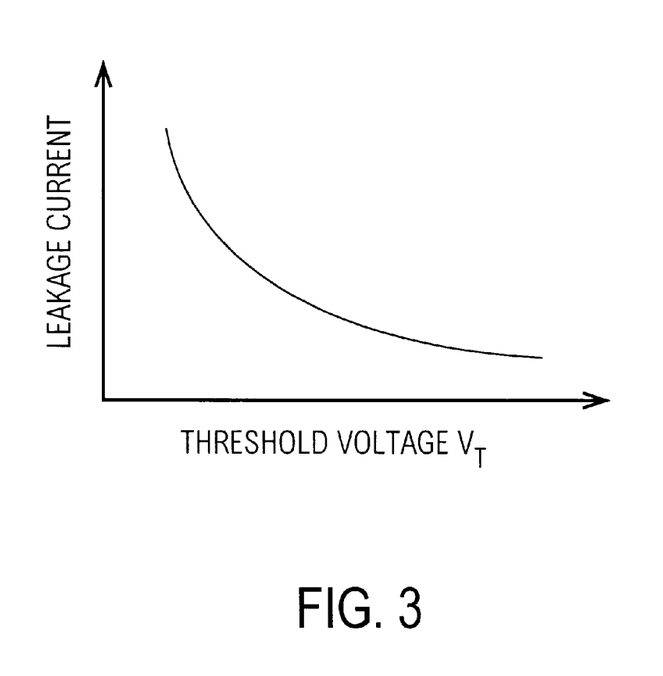
FIG. 3 is a graph illustrating how background leakage current varies as a function of threshold voltage for the least erased cells.

FIG. 3 illustrates how the background leakage current of a cell varies as a function of threshold voltage. The lower (more negative) the threshold voltage, the higher the leakage current. It is therefore desirable to prevent cells from being overerased and reduce the threshold voltage distribution to as low a range as possible, with ideally all cells having the same high threshold voltage after erase on the order of 2 V.

It is known in the art to reduce the threshold voltage distribution by performing an overerase correction operation which reprograms the most overerased cells to a higher threshold voltage. This operation will result in the threshold voltage curve being altered to the shape indicated by broken line in FIG. 2 in which the threshold voltages of all of the cells are above the minimum acceptable value $V_T$MIN. An overerase correction operation of this type is generally known as Automatic Programming Disturb (APD).

An APD method which is referred to as Automatic Programming Disturb Erase (APDE) is disclosed in U.S. Pat. No. 5,642,311, entitled "OVERERASE CORRECTION FOR FLASH MEMORY WHICH LIMITS OVERERASE AND PREVENTS ERASE VERIFY ERRORS", issued Jun. 24, 1997 to Lee Cleveland. The method includes sensing for overerased cells and applying programming pulses thereto which bring their threshold voltages back up to acceptable values.

It is common in the art to organize the individual cells of a flash EEPROM into a plurality of banks or sectors. A typical EEPROM will comprise, for example, 8 sectors, each of which includes 512K memory cells. A considerable saving of time would be achieved if the sectors could be erased in parallel. However, the current erase and APDE methodology does not allow multi-sector erase of NOR type flash EEPROMs since it results in a wider erased threshold distribution compared to single sector erase. This is exacerbated if the sectors being erased have vastly different cycling histories. If the sectors are erased sequentially, the erase time is multiplied as more sectors need erase.

SUMMARY OF THE INVENTION

It is an object of the present invention to provide a method for erasing a flash Electrically-Erasable Programmable Read-Only Memory (EEPROM) which overcomes the above described limitations of the prior art.

More specifically, a flash Electrically-Erasable Programmable Read-Only Memory (EEPROM) according to the present invention includes a plurality of field effect transistor memory cells, a power supply, and a controller which cooperates with the power supply to apply an erase pulse to the cells, and then erase verify a first byte of cells in each sector. If the first byte in all sectors has not passed erase verify, another erase pulse is applied to the non-passing sectors, and the first byte in each sector which did not pass erase verify the first time is erase verified once again.

This procedure is continued until the first byte in each sector has passed erase verify. Only then, are the sectors processed in sequence to erase and erase verify every cell. First, an erase pulse is applied to all of the cells in the sector. Then, the first byte is erase verified. If the first byte passes erase verify (which it will because it did previously), the next byte is erase verified.

Whenever a particular byte does not pass erase verify, another erase pulse is applied to all of the cells in the sector, and the particular cell is again erase verified. This procedure is sequentially performed on all of the bytes in the sector, or alternatively on the cells individually, until all of the cells have passed erase verify.

The present invention substantially reduces the length of time required to perform an erase operation. Typically, the length of time required to perform the present erase operation is less than one-half that required to perform a conventional erase operation. The present method achieves this saving in time without adversely affecting the threshold voltage distribution of the cells.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 4:
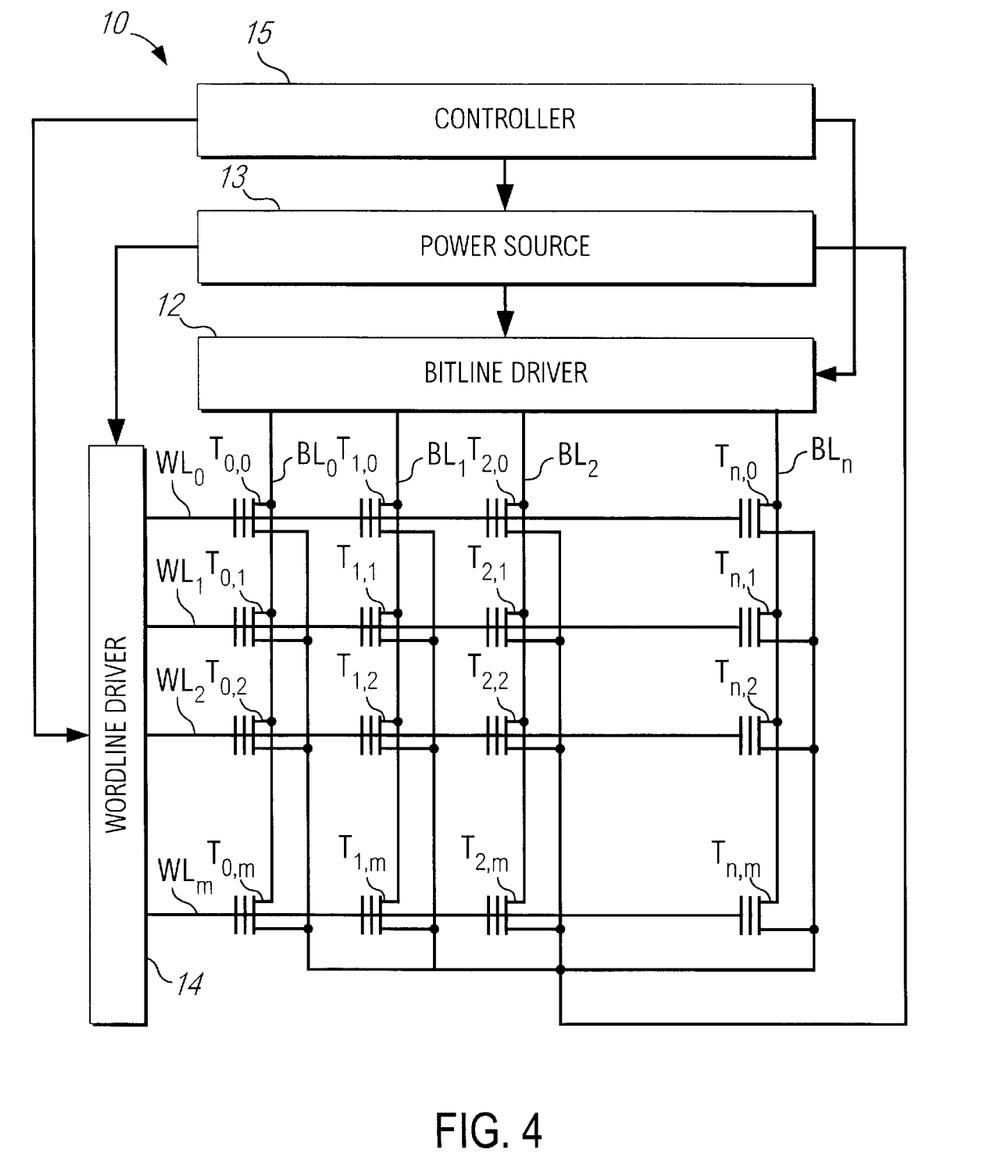
FIG. 4 is a simplified electrical schematic diagram of a flash EEPROM.

FIG. 4 illustrates the basic configuration of a NOR type flash Electrically Erasable Programmable Read-Only Memory (EEPROM) 10 to which the present invention is advantageously applied. The memory 10 comprises a plurality of core or memory cells which are arranged in a rectangular matrix or array of rows and columns. Each row is associated with a wordline, whereas each column is associated with a bitline.

Assuming that there are n columns and m rows, the bitlines are designated as $BL_0$ to $BL_n$, and the wordlines are designated as $WL_0$ to $WL_m$. Appropriate voltages are applied to the bitlines by a bitline driver 12, whereas appropriate voltages are applied to the wordlines by a wordline driver 14. The voltages applied to the drivers 12 and 14 are generated by a power source or supply 13 under the control of a controller 15 which is typically on-chip logic circuitry. The controller 15 also controls the drivers 12 and 14 to address the memory cells individually or collectively as will be described below.

A memory cell is located at each junction of a wordline and a bitline. Each cell includes a Metal-Oxide-Semiconductor (MOS) Field-Effect Transistor (FET) having a source, drain, gate oxide and control gate. The cells of a flash EEPROM differ from conventional FETs in that they additionally include a floating gate and tunnel oxide layer disposed underneath the gate oxide and control gate.

The cells illustrated in FIG. 4 are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the power supply 13.

A cell is programmed by applying, typically, 9 V to the control gate, 5 V to the drain and grounding the source, which causes hot electrons to be injected from the drain depletion region into the floating gate. Upon removal of the programming voltages, the injected electrons are trapped in the floating gate and create a negative charge therein which increases the threshold voltage of the cell to a value in excess of approximately 4 V.

The cell is read by applying typically 5 V to the control gate and 1 V to the bitline to which the drain is connected, grounding the source, and sensing the bitline current. If the cell is programmed and the threshold voltage is relatively high (4 V), the bitline current will be zero or at least relatively low. If the cell is not programmed or erased, the threshold voltage will be relatively low (2 V), the control gate voltage will enhance the channel, and the bitline current will be relatively high.

Reading, and verifying, as will be described below, are preferably performed using sense amplifiers and a reference current array as disclosed in the above referenced patent to Cleveland. The details of these elements are not the particular subject matter of the present invention.

A cell can be erased in several ways. In one arrangement, a cell is erased by applying typically 12 V to the source, grounding the control gate and allowing the drain to float. This causes the electrons which were injected into the floating gate during programming to be removed by Fowler-Nordheim tunneling from the floating gate through the thin tunnel oxide layer to the source. Alternatively, a cell can be erased by applying a negative voltage on the order of −10 V to the control gate, applying 5 V to the source and allowing the drain to float.

Figure 5:
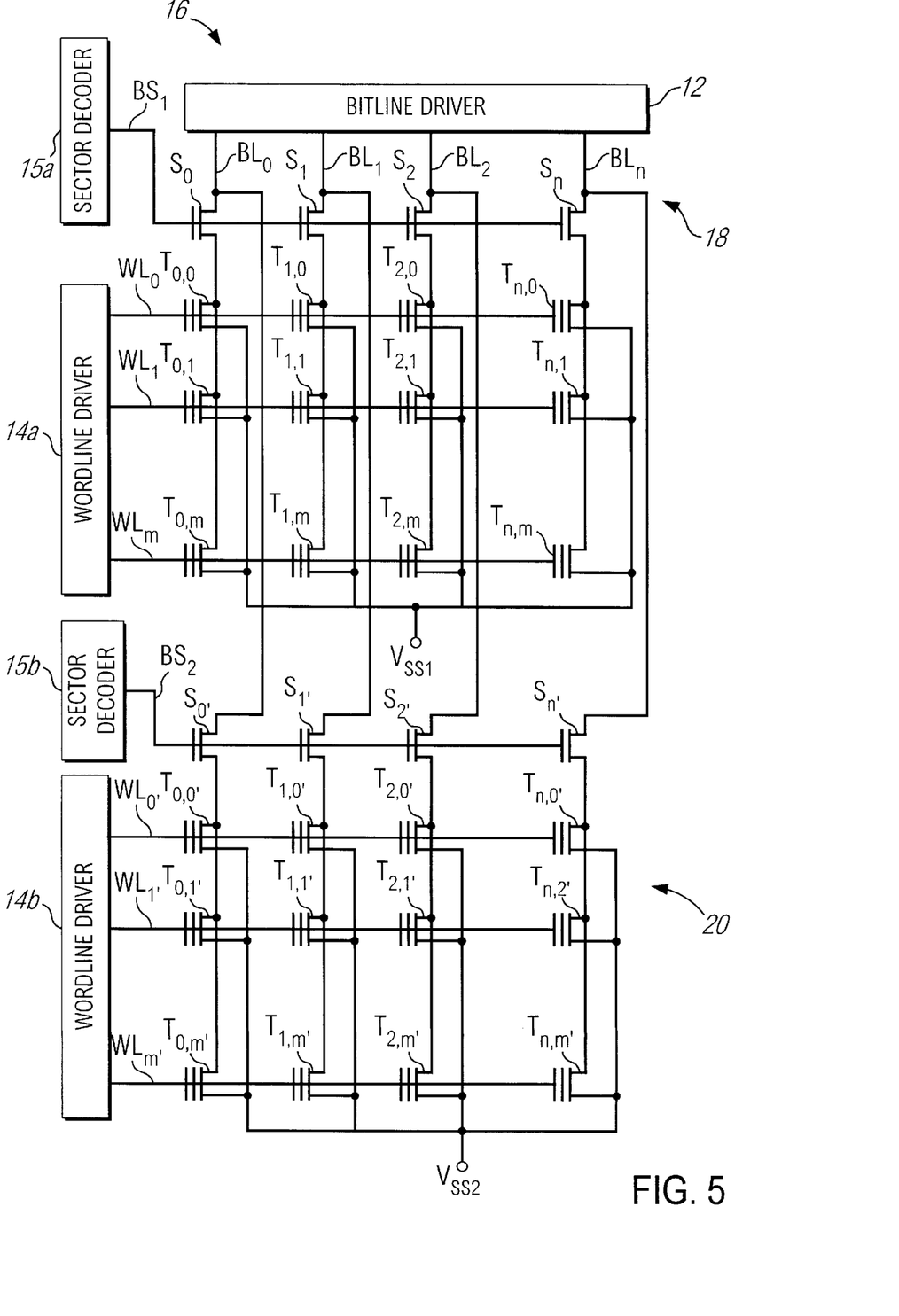
FIG. 5 is similar to FIG. 4 but illustrates a flash EEPROM having cells arranged in pages or banks.

As described above, it is common to organize the individual memory cells of a flash EEPROM into a plurality of banks or sectors. FIG. 5 illustrates a flash EEPROM memory 16 according to the present invention which is similar to the memory except that the cells are divided into a plurality, in the illustrated example two, of banks (also known as pages or sectors), each of which can be programmed, erased and read independently.

A typical EEPROM will comprise, for example, 8 sectors, each of which includes 512K memory cells. For simplicity of illustration and description, the memory 16 is shown as including only a first cell bank 18 and a second cell bank 20. However, it will be understood that the present invention is applicable to a memory having any number of sectors or banks. The memory 16 also includes a controller and a power source or supply similar to the memory 10, although not explicitly illustrated.

The memory cells in the first bank 18 are designated in the same manner as in FIG. 4, whereas a prime symbol is added to the designations of the cells in the second bank 20. The wordlines of the banks 18 and 20 are connected to separate wordline drivers 14a and 14b respectively.

In addition to the memory cells, each bank 18 and 20 includes a select transistor for each bitline. The select transistors for the banks 18 and 20 are designated as $S_0$ to $S_n$ and $S_0'$ to $S_n'$ respectively. The drains of the select transistors are connected to the respective bitlines, whereas the sources of the select transistors are connected to the drains of the transistors for the wordlines $WL_0$ to $WL_m$ and $WL_0'$ to $WL_m'$.

The select transistors differ from the memory cell transistors in that they are conventional MOSFETs and lack floating gates. The select transistors are switching elements rather than memory elements. The gates of the select transistors for the bank 18 are connected to a bank select output $BS_1$ of a sector decoder 15a, whereas the gates of the select transistors for the bank 20 are connected to a bank select output $BS_2$ of a sector decoder 15b.

The sources of the cells in bank 18 are connected to a common source supply voltage $V_{ss}1$, whereas the sources of the cells in the bank 20 are connected to a common source supply voltage $V_{ss}2$.

The bank 18 is selected by applying a logically high signal to the bank select line $BS_1$ which turns on the transistors $S_0$ to $S_n$ and connects the bitlines $BL_0$ to $BL_n$ to the underlying memory cells. The bank 18 is deselected by applying a logically low signal to the bank select line $BS_1$ which turns off the transistors $S_0$ to $S_n$ and disconnects the memory cells from the bitlines. The bank 20 is selected and deselected in an essentially similar manner using the bank select signal $BS_2$ and select transistors $S_0'$ to $S_n'$. The operation of the memory 16 is essentially similar to that of the memory 10, except that the program, erase and read operations are performed on the banks 18 and 20 sequentially and independently.

Figure 6:
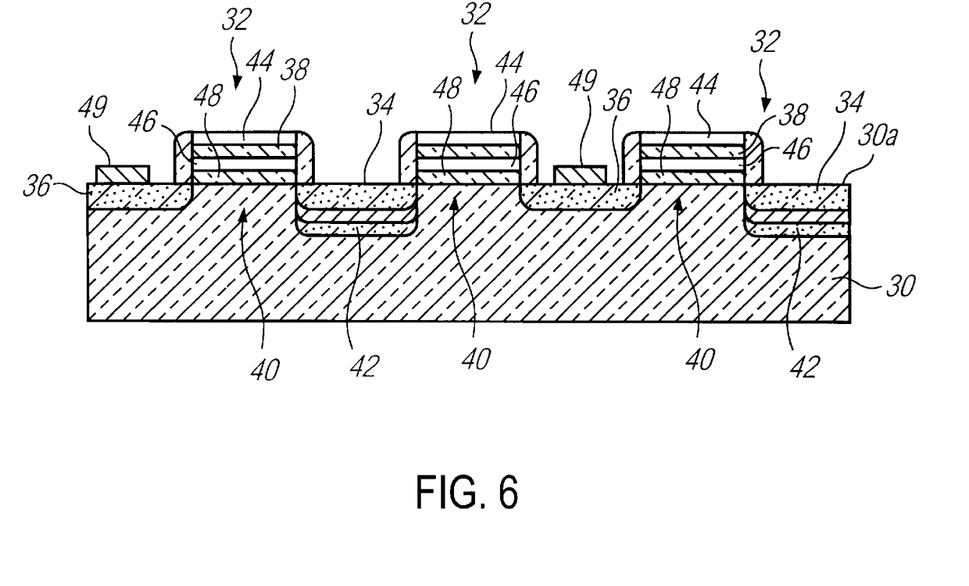
FIG. 6 is a simplified partial sectional view of a flash EEPROM illustrating the elements of the cells thereof.

FIG. 6 is a simplified sectional view illustrating the construction of the individual memory cells of the memory 10 or 16. The memory is formed on a silicon or other semiconductor substrate 30. Three erasable memory cells 32 are illustrated as being formed on a surface 30a of the substrate 30, each including a Metal-Oxide-Semiconductor (MOS) Field-Effect Transistor (FET) structure having a source 34, drain 36, an interdielectric layer 38, and channel 40 underlying a tunnel oxide layer 48. A polysilicon control gate 44 is formed over each gate oxide layer 38, and a polysilicon floating gate 46 and the tunnel oxide layer 48 are formed underneath the control gate 44 over the channel 40.

Each pair of cells 32 is arranged to share a common source 34 and drain 36. The sources 34 are connected to a common source line, whereas a bitline connection 49 is formed on each drain 36.

The present multi-sector erase method includes two main operations. In the first operation, the sectors are erased together and verified until the first byte (or other selected cell or subset of cells) in each sector has passed erase verify. This brings all of the sectors together up to a point at which of the cells are approximately 75% erased. In the second operation, the sectors are processed sequentially, with each cell in the sector being erase verified individually.

More specifically, the first operation is begun by applying one or more erase pulses to all of the cells in a multi-sector memory such as the memory 16 illustrated in FIG. 5. Then, the first byte in each sector is erase verified. If the first byte in each sector passes erase verify, the method progresses to the second operation.

If the first byte in any sector did not pass erase verify, one or more additional erase pulses are applied to all of the sectors that did not pass. The other sectors are not pulsed. Then, the first byte of each sector which did not previously pass erase verify is erase verified again. This procedure is repeated until the first byte of each sector has passed erase verify.

It will be understood that various modifications are contemplated within the scope of the invention. For example, rather than erase verifying the first byte in each sector, the method can erase verify any other selected byte in a sector, such as a randomly selected byte. The method can also erase verify any other appropriate subset of cells, which can each consist of an individual cell or bit. For example, the method can erase verify the first cell, last cell, a randomly selected cell, etc. within the scope of the invention.

As described above, it is preferable to erase verify only those sectors which did not pass erase verify previously. This can be performed by providing a register or other logic element which includes a latch or flag bit representing each sector. For example, all of the flag bits can initially be set to zero. Then, as the first byte of each sector passes erase verify, the corresponding flag bit is set to one. If at least one flag bit is still zero, erase verify will be performed for each sector which has a corresponding zero flag bit.

It is further within the scope of the invention to erase verify the first byte of all of the sectors during each repetition of the first operation (rather than only the sectors which have not passed erase verify) until all of them pass erase verify. This can simplify the logic structure which keeps track of the sectors that have passed erase verify. However, erase verifying a sector which has previously passed erase verify is a redundant operation that increases the length of time required to perform the present method, and for this reason the modification of erase verifying all sectors until they all pass erase verify is a less preferred embodiment of the invention.

After the first bytes (or other selected subset of cells) of all of the sectors have passed erase verify, the method proceeds to the second main operation which is performed on the sectors individually in sequence. Whereas in the first operation only the first bytes in the sectors were erase verified, in the second operation all of the cells are erase verified individually.

For each sector, at least one erase pulse is applied to all of the cells. Then, the first byte in the sector is erase verified. If it passes erase verify (which it will if the first bytes in the sectors were selected for erase verify in the first operation), the next byte is erase verified. Whenever a particular byte does not pass erase verify, at least one additional erase pulse is applied to all of the cells in the sector, and the particular byte is again erase verified. This procedure is sequentially performed on all of the bytes in the sector until all of the bytes have passed erase verify.

It will be understood that collectively erase verifying a byte of cells results in erase verifying each cell in the byte. This is because sufficient erase pulses are applied until all of the cells or bits in the byte become erased to the point at which the byte collectively passes erase verify. However, it is further within the scope of the invention to individually erase verify each cell, or to erase any other subset of cells as a unit.

Figure 7:
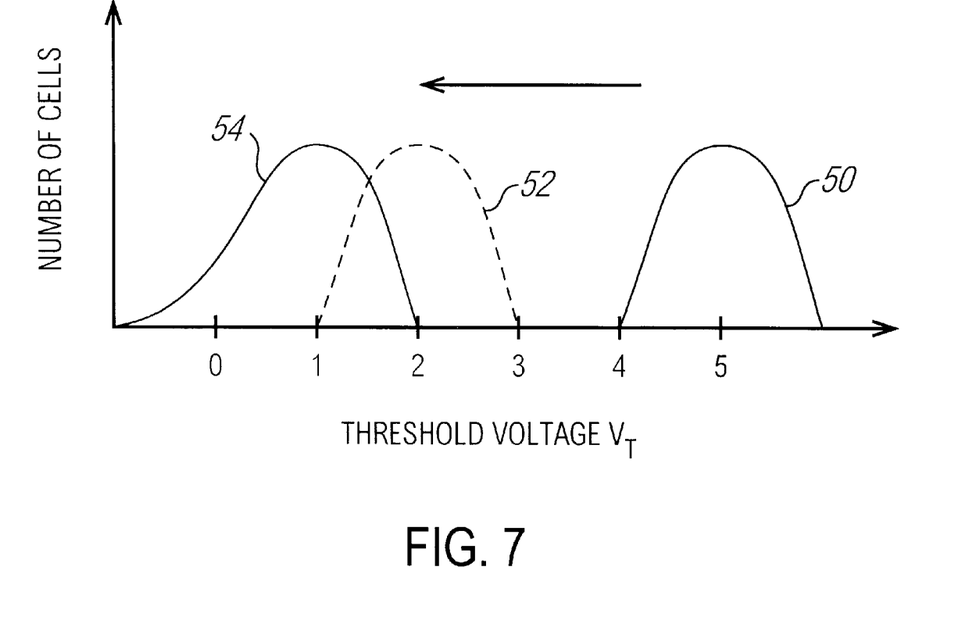
FIG. 7 is a graph illustrating a method of erasing a sector of memory cells in accordance with the present invention.

FIG. 7 is a graph which is similar to FIG. 2, illustrating the threshold voltage distribution of a sector of cells as the present method or process progresses. A curve 50 illustrates the initial threshold voltage distribution prior to beginning the present erase method. The threshold voltage will range from approximately 4 V to 6 V, with an average or typical cell having a threshold voltage of approximately 5 V as represented by the peak of the curve.

Performing the first operation results in shifting the curve leftwardly along the horizontal axis to a position 52 in which a typical cell has a threshold voltage of approximately 2 V. The peak of the curve 52 corresponds to the cutoff voltage for the erase verify procedure, in this example 2 V, assuming that the first byte (or other selected subset of cells) in the sector is typical. In this manner, the curve has been shifted leftwardly by approximately 3 V from the position 50 to the position 52.

Performing the second operation results in a final curve 54 which is shifted leftwardly by 1 V to a peak position of approximately 1 V. The curve 54 is shifted by 4 V from the curve 50. The curve 54 indicates that all of the cells have been erase verified such that their threshold voltages are lower than 2 V.

Figure 8:
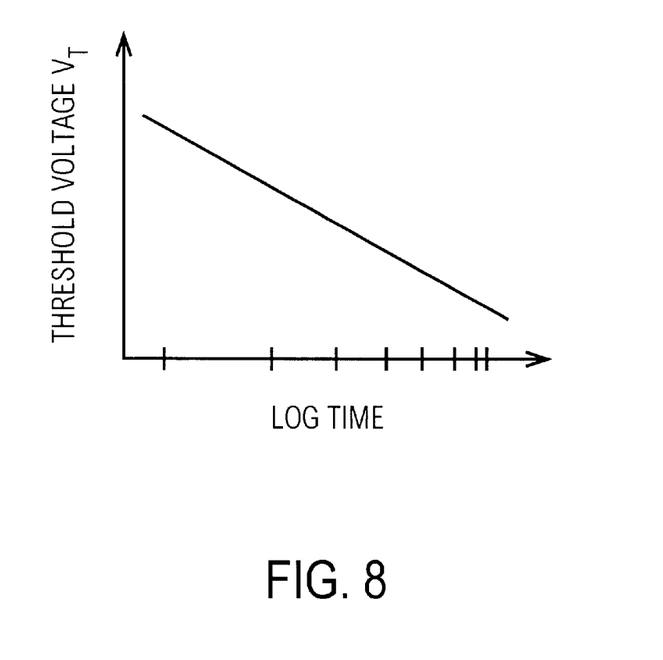
FIG. 8 is a graph illustrating how the threshold voltage of a memory cell varies as a logarithmic function of time.

FIG. 8 illustrates how threshold voltage $V_T$ varies as a logarithmic function of time. More specifically, the threshold voltage is inversely proportional to the logarithm of time. This relationship is useful in that it enables the time saving advantage of the present invention to be presented quantitatively.

EXAMPLE

It will be assumed that a memory which is being erased in accordance with the present method comprises 8 sectors of cells, and that the length of time required to erase one sector using the conventional method (e.g. the second operation of the present method) is one time unit (e.g. 1 second). Conventionally, 8 time units are required to erase 8 sectors. It will be further assumed that the first byte of each sector (or other selected subset of cells) is typical.

As viewed in FIG. 7, the first operation in which all of the sectors are erased together reduces the threshold voltage of a typical cell by 3 V from 5 V to 2 V. The second operation further reduces the threshold voltage by one more volt from 2 V to 1 V. Thus, the first operation results in a reduction of 75% of the total reduction of threshold voltage (3 V/4 V=0.75).

Using the relationship illustrated in FIG. 8, the threshold voltage is inversely proportional to the logarithm of time. Thus, the time required to perform the first operation is antilog (0.75)=0.56 time unit. This is the total time required to perform the first operation on all 8 sectors.

The time required to perform the second operation on each sector is 1−0.56−0.44 time unit. Thus, the total time required to perform the present erase method on all 8 sectors is (1×0.56) time units for the first operation+(8×0.44)=3.52 time units for the second operation for a total of 4.08 time units. Thus, the present erase method, assuming that the cells selected for the first operation are typical, takes only approximately 50% as long as the conventional method. This is a highly substantial saving of time which can be well used for performing other computer operations.

Even if the first byte of one or more sectors is not typical, the present method is still faster than the conventional method, and in a worst case scenario in which the first bytes in all sectors are the slowest in the memory, the time required for the present method reduces to the time required for the conventional method.

For example, if the first byte in one of the sectors is the slowest in the memory and the first bytes in the other 7 sectors are typical, the time required for the present erase method is approximately (1×1.0 time units) for the first operation+(7×0.44 units) for the second operation=4.08 time units. Thus, the saving in time is not substantially different from the case in which the first bytes in all 8 sectors are typical, and is still approximately 50%.

In summary, the present invention substantially reduces the length of time required to perform an erase operation. Typically, the length of time required to perform the present erase operation is less than one-half that required to perform a conventional erase operation. The saving in time is provided by the first operation which erases all of the sectors of the memory together to approximately 75% of their final value in less time than is required to erase a single sector using the conventional method. The present method achieves this saving in time without adversely affecting the threshold voltage distribution. This is because the second operation produces essentially the same threshold voltage distribution as the conventional erase operation.

Various modifications will become possible for those skilled in the art after receiving the teachings of the present disclosure without departing from the scope thereof.

We claim:

1. A method for erasing a flash Electrically-Erasable Programmable Read-Only Memory (EEPROM) which includes a plurality of sectors of memory cells, comprising the steps of:

(a) applying an erase pulse to the cells;

(b) erase verifying a selected subset of cells in each sector which has not passed erase verify;

(c) if the selected subsets in any sector has not passed erase verify, repeating steps (a) and (b) on those sectors only;

(d) if the selected subsets in all sectors have passed erase verify, applying additional erase pulses and erase verifying the cells until all of the cells have passed erase verify.

2. A method as in claim 1, in which each of the selected subsets comprises a byte of cells.

3. A method as in claim 1, in which each of the selected subsets comprises a first byte of cells in a sector.

4. A method as in claim 1, in which each of the selected subsets is randomly selected.

5. A method as in claim 1, in which each of the selected subsets comprises a single cell in a sector.

6. A method as in claim 1, in which each of the selected subsets comprises a first cell in a sector.

7. A method as in claim 1, in which step (d) is performed on the sectors sequentially.

8. A method as in claim 7, in which step (d) comprises the substeps, for each sector, of:

(d1) sequentially erase verifying all subsets; and (d2) if a particular subset does not pass erase verify, alternatingly applying an erase pulse to all of the cells in the sector and erase verifying the particular subset until the particular subset passes erase verify.

9. A method as in claim 8, in which each of the subsets comprises a byte of cells.

10. A method as in claim 8, in which each of the subsets comprises a single cell.

11. A flash Electrically-Erasable Programmable Read-Only Memory (EEPROM), comprising:

a plurality of field effect transistor memory cells;

a power supply; and a controller which cooperates with the power supply to perform the steps of:

(a) applying an erase pulse to the cells;

(b) erase verifying a selected subset of cells in each sector which has not passed erase verify;

(c) if the selected subsets in any sector has not passed erase verify, repeating steps (a) and (b) on those sectors only;

(d) if the selected subsets in all sectors have passed erase verify, applying additional erase pulses and erase verifying the cells until all of the cells have passed erase verify.

12. A memory as in claim 11, in which each of the selected subsets comprises a byte of cells.

13. A memory as in claim 11, in which each of the selected subsets comprises a first byte of cells in a sector.

14. A memory as in claim 11, in which each of the selected subsets is randomly selected.

15. A memory as in claim 11, in which each of the selected subsets comprises a single cell in a sector.

16. A memory as in claim 11, in which each of the selected subsets comprises a first cell in a sector.

17. A memory as in claim 11, in which step (d) is performed on the sectors sequentially.

18. A memory as in claim 17, in which step (d) comprises the substeps, for each sector, of:

(d1) sequentially erase verifying all subsets; and (d2) if a particular subset does not pass erase verify, alternatingly applying an erase pulse to all of the cells in the sector and erase verifying the particular subset until the particular subset passes erase verify.

19. A memory as in claim 18, in which each of the subsets comprises a byte of cells.

20. A memory as in claim 18, in which each of the subsets comprises a single cell.

* * * * *